United States Patent
Pillay et al.

(10) Patent No.: US 10,768,227 B2
(45) Date of Patent: Sep. 8, 2020

(54) SYSTEMS AND METHODS FOR ANALYZING FAILURE RATES DUE TO SOFT/HARD ERRORS IN THE DESIGN OF A DIGITAL ELECTRONIC DEVICE

(71) Applicant: Mentor Graphics Corporation, Wilsonville, OR (US)

(72) Inventors: Sanjay Pillay, Austin, TX (US); Arun Kumar Gogineni, Cedar Park, TX (US)

(73) Assignee: Mentor Graphics Corporation, Wilsonville, OR (US)

( * ) Notice: Subject to any disclaimer, the term of this patent is extended or adjusted under 35 U.S.C. 154(b) by 149 days.

(21) Appl. No.: 16/013,931

(22) Filed: Jun. 20, 2018

(65) Prior Publication Data

US 2018/0364306 A1 Dec. 20, 2018

Related U.S. Application Data

(60) Provisional application No. 62/522,098, filed on Jun. 20, 2017.

(51) Int. Cl.
| | |
|---|---|
| *G06F 30/00* | (2020.01) |
| *G01R 31/317* | (2006.01) |
| *G01R 31/3181* | (2006.01) |
| *G06F 30/3323* | (2020.01) |
| *G06F 30/33* | (2020.01) |
| *G06F 30/327* | (2020.01) |

(52) U.S. Cl.
CPC . *G01R 31/31704* (2013.01); *G01R 31/31816* (2013.01); *G06F 30/3323* (2020.01); *G06F 30/327* (2020.01); *G06F 30/33* (2020.01)

(58) Field of Classification Search
CPC .. G01R 31/31704; G06F 30/33; G06F 30/327
USPC .......................................................... 716/102
See application file for complete search history.

(56) References Cited

U.S. PATENT DOCUMENTS

| | | | |
|---|---|---|---|
| 2007/0100586 A1* | 5/2007 | Cheng ............ | G01R 31/318547 702/185 |
| 2009/0193296 A1* | 7/2009 | Kellington ....... | G01R 31/31816 714/33 |
| 2013/0007549 A1* | 1/2013 | Chan ..................... | G06F 11/261 714/741 |
| 2019/0095298 A1* | 3/2019 | Fricano .................. | G06F 30/33 |
| 2019/0171539 A1* | 6/2019 | Pillay ..................... | G06F 30/15 |
| 2019/0187207 A1* | 6/2019 | Pillay .................... | G06F 30/367 |

* cited by examiner

*Primary Examiner* — Suchin Parihar
(74) *Attorney, Agent, or Firm* — Mentor Graphics Corporation

(57) ABSTRACT

A method is provided for analyzing failure rates due to soft/hard errors in the design of a digital electronic device. The method includes creating an error injection point by introducing a fault into a code path having a plurality of levels; determining an error detection point at which the introduced fault becomes detectable; creating a list of all of the logic cells forming the cone of logic that forms the data input to the error detection point, thereby generating a first logic cone list; creating a list of all of the logic cells forming the cone of logic that forms the data input to the error injection point, thereby generating a second logic cone list; determining the intersection between the first and second logic cone lists; and conducting a failure rate analysis on the intersection between the first and second logic cone lists.

8 Claims, 12 Drawing Sheets

SAFETY SYNTHESIS OPTIONS

| Features | Annealer | RadioScope |
|---|---|---|
| ERROR DETECTION & CORRECTION | | |
| Hamming Code Based *n-bit detect/m-bit correct* | ✓ | ✓ |
| Structures Supported | RAM, ROM, Reg Files, FIFOS, stacks | Flip-Flop Banks |
| User-Defined Structure Selection | ✓ | ✓ |
| Auto-Grouping of Structures | X | ✓ |
| User Selectable Option (Parity vs EDC vs ECC) | ✓ | ✓ |
| Multi-Pass w/ Incremental Safety Insertion Mode | ✓ | ✓ |
| FAULT TOLERANCE | | |
| Redundancy | MacroModule Level | Localized Logic Cones |
| Duplicity/Triplication | ✓ | ✓ |
| Multi-Clock Designs | ✓ | ✓ |
| Auto-Identification | Memories | State Machines |
| Protocol Checks | | |
| Covered Items | InterfaceParity/protocol, FIFO overflow/underrun | FSM Valid states & transitions |

FIG. 6

SYSTEMS AND METHODS FOR ANALYZING FAILURE RATES DUE TO SOFT/HARD ERRORS IN THE DESIGN OF A DIGITAL ELECTRONIC DEVICE

CROSS-REFERENCE TO RELATED APPLICATIONS

This application claims priority from U.S. Provisional Application No. 62/522,098, entitled "SYSTEMS AND METHODS FOR ANALYZING FAILURE RATES DUE TO SOFT/HARD ERRORS IN THE DESIGN OF A DIGITAL ELECTRONIC DEVICE", which was filed on Jun. 20, 2017, and which is incorporated herein by reference in its entirety.

TECHNICAL FIELD OF THE DISCLOSURE

The present disclosure pertains generally to electronic design automation tools used to analyze the failures rates due to soft or hard errors in VLSI (very large-scale integration) designs, and more specifically, to systems and methods for formally analyzing failure rates due to soft errors in such designs.

BACKGROUND OF THE DISCLOSURE

Failure Mode and Effects Analysis (FMEA) is a method for examining potential failures in products or processes. FMEA helps selecting remedial actions that reduce cumulative impacts of life-cycle consequences (risks) from a systems failure (fault). FMEA is frequently used in conjunction with design and manufacturing processes, and has found many applications in the automotive, aerospace and biomedical industries, and in other safety critical or security related industries.

The use of FMEA in performing gate level timing simulations of the designs of digital electronic devices is especially prevalent. Unfortunately, such simulations have become increasingly time consuming to run as the number of gates in the designs of such devices has increased. For example, at present, the designs of many digital devices contain several million gates. Hence, a need exists in the art to reduce the time required for such simulations, without sacrificing the ability of the simulation to identify critical faults in the design.

SUMMARY OF THE DISCLOSURE

In one aspect, a method is provided for analyzing failure rates due to soft/hard errors in the design of a digital electronic device. The method comprises (a) creating an error injection point by introducing a fault into a code path having a plurality of levels; (b) determining an error detection point at which the introduced fault becomes detectable; (c) creating a list of all of the logic cells forming the cone of logic that forms the data input to the error detection point, thereby generating a first logic cone list; (d) creating a list of all of the logic cells forming the cone of logic that forms the data input to the error injection point, thereby generating a second logic cone list; (e) determining the intersection between the first and second logic cone lists; and (f) conducting a failure rate analysis on the intersection between the first and second logic cone lists.

In another aspect, a method is provided for analyzing failure rates due to soft/hard errors in the design of a digital electronic device. The method comprises (a) creating, on a computational device, a list of the storage elements in the design, thereby generating a storage element list; (b) identifying a state machine in the design; (c) extracting a cone of logic associated with the identified state machine; and either (i) creating at least one copy of the cone of logic associated with the identified state machine, and comparing the at least one copy of the cone logic with the original cone logic to detect any deviations between them, or (ii) performing a protocol check on the state machine.

In a further aspect, a method is provided for verifying single point errors in the design of a digital electronic device. The method comprises (a) creating, on a computational device, a list of the storage elements in the design, thereby generating a storage element list; (b) injecting a plurality of single point faults into the design such that at least one of the plurality of single point faults is injected into the design; and (c) independently performing a fault campaign on each of the plurality of single point faults in a single run.

In yet another aspect, a method is provided for identifying single point errors in the design of a digital electronic device. The method comprises (a) identifying a VCD file likely to create and propagate a fault; (b) identifying the time window where the probability of creating and propagating a fault is high; and (c) ascertaining the cone of logic that creates the fault and that propagates the faults to the next state element.

BRIEF DESCRIPTION OF THE DRAWINGS

For a more complete understanding of the present invention and the advantages thereof, reference is now made to the following description taken in conjunction with the accompanying drawings in which like reference numerals indicate like features.

FIG. 6 is a tabulation of safety synthesis options for the tool suite of FIG. 1.

DETAILED DESCRIPTION OF THE DISCLOSURE

Figure 1:
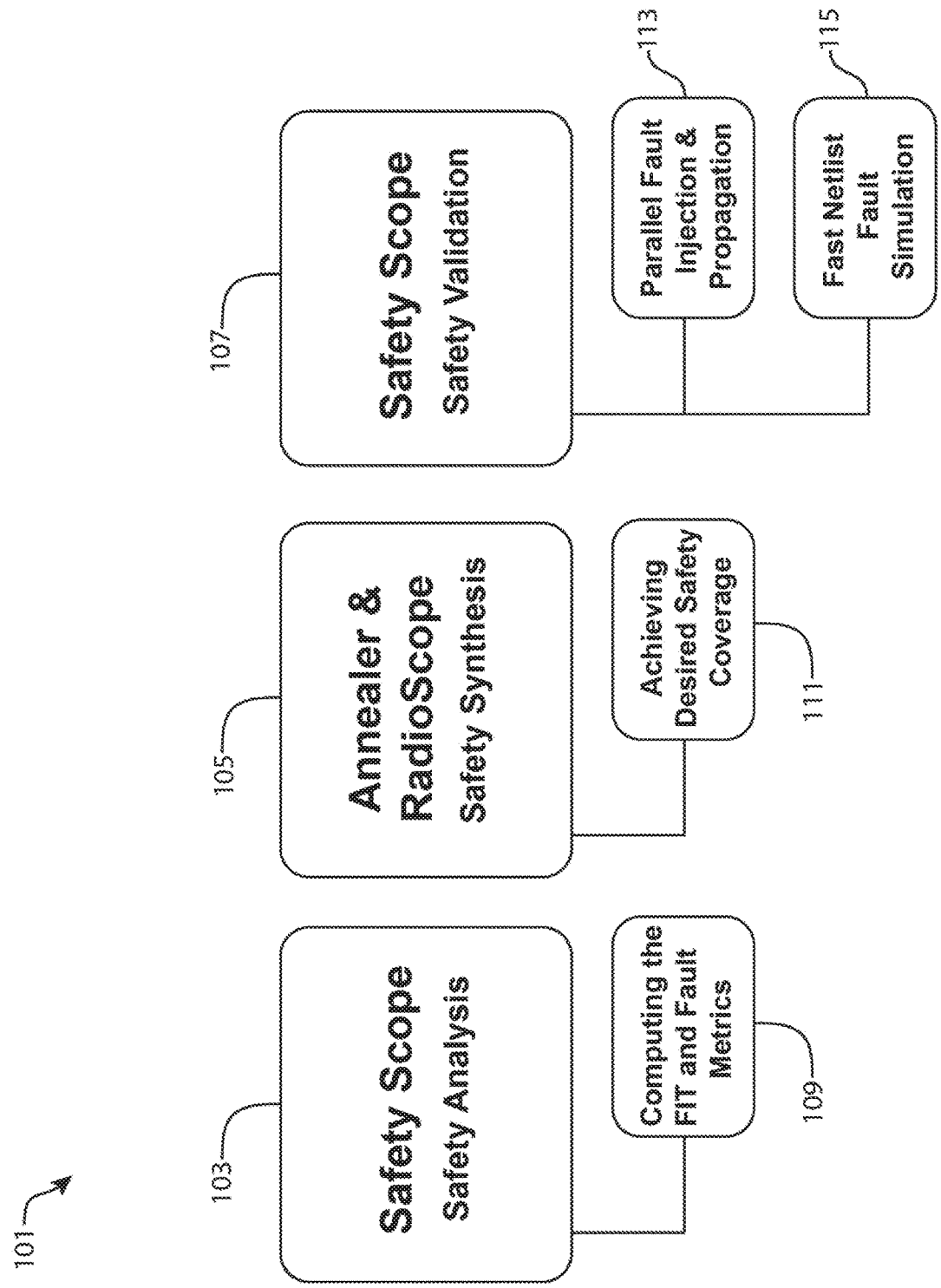
FIG. 1 is an illustration of a particular, non-limiting embodiment of a tool suite in accordance with the teachings herein.

It has now been found that some or all of the foregoing needs in the art may be met with the suite of tools disclosed herein, and the systems and methodologies that these tools incorporate or implement. In a preferred embodiment, these tools provide significant improvements in the speed of FMEA analyses through the selective use of logic cones to identify the impacted points of a design during a fault injection campaign. This approach allows simulations during the fault campaign to be restricted to only a small portion of the overall design without adversely impacting the efficacy of the fault campaign, and is preferably implemented through the use of RTL simulation-based VCDs. As a result, the required simulations may be conducted in parallel, and significant reductions in the amount of time required for the simulations may be realized. These tools may be utilized to provide complete safety solutions for analyzing, enhancing and verifying the robustness of designs for various applications including, for example, applications in the automotive, medical, industrial and enterprise markets.

The systems and methodologies disclosed herein will frequently be described with respect to their implementation in, or by, a suite of tools which includes the tools denoted herein as SafetyScope, Annealer, RadioScope and KaleidoScope. However, reference to these tools is for illustrative purposes only and is not intended to be limiting. Hence, one skilled in the art will appreciate that the systems and methodologies disclosed herein are capable of being implemented in various ways using various tools. These systems and methodologies may be further understood in the context of U.S. Ser. No. 15/285,470 (Pillay), entitled "SYSTEMS AND METHODS FOR ANALYZING SOFT ERRORS IN A DESIGN AND REDUCING THE ASSOCIATED FAILURE RATES THEREOF", which was filed on Oct. 4, 2016, and U.S. Ser. No. 15/288,912 (Pillay), entitled "LOW POWER VLSI DESIGNS USING CIRCUIT FAILURE IN SEQUENTIAL CELLS AS LOW VOLTAGE CHECK FOR LIMIT OF OPERATION", which was filed on Oct. 7, 2016, both of which are incorporated herein by reference in their entirety.

Definitions

The following terms as used in this disclosure have the meanings specified below.

"Netlist" refers to a textual description of the connectivity of an electrical circuit made of components. Since components are generally gates, a netlist is typically a connection of gates.

"Register Transfer Language" (RTL) refers to an Intermediate Representation (IR) used to describe data flow at the register-transfer level of an architecture. RTL is a design abstraction which models a synchronous digital circuit in terms of the flow of digital signals (data) between hardware registers, and the logical operations performed on those signals.

"Flip-flop" refers to a circuit that has two stable states, and which can be used to store information. Flip-flops serve as the basic storage elements in the designs of many digital electronic devices.

"Failure in time rate" or "FIT rate" refers to the frequency with which an engineered system or component fails. The FIT rate is typically expressed in failures per unit time.

"MUX cell" refers to a multiplexor cell. Such a cell selects one of several input signals and forwards the selected input signal into a single line. Thus, for example, a multiplexer of $2^n$ inputs has n select lines, which are used to select which input line to send to the output.

"Clocking event" refers to a periodic event which causes the state of a memory element to change. A clocking event can be rising or falling edge, or high or low level.

Figure 9:
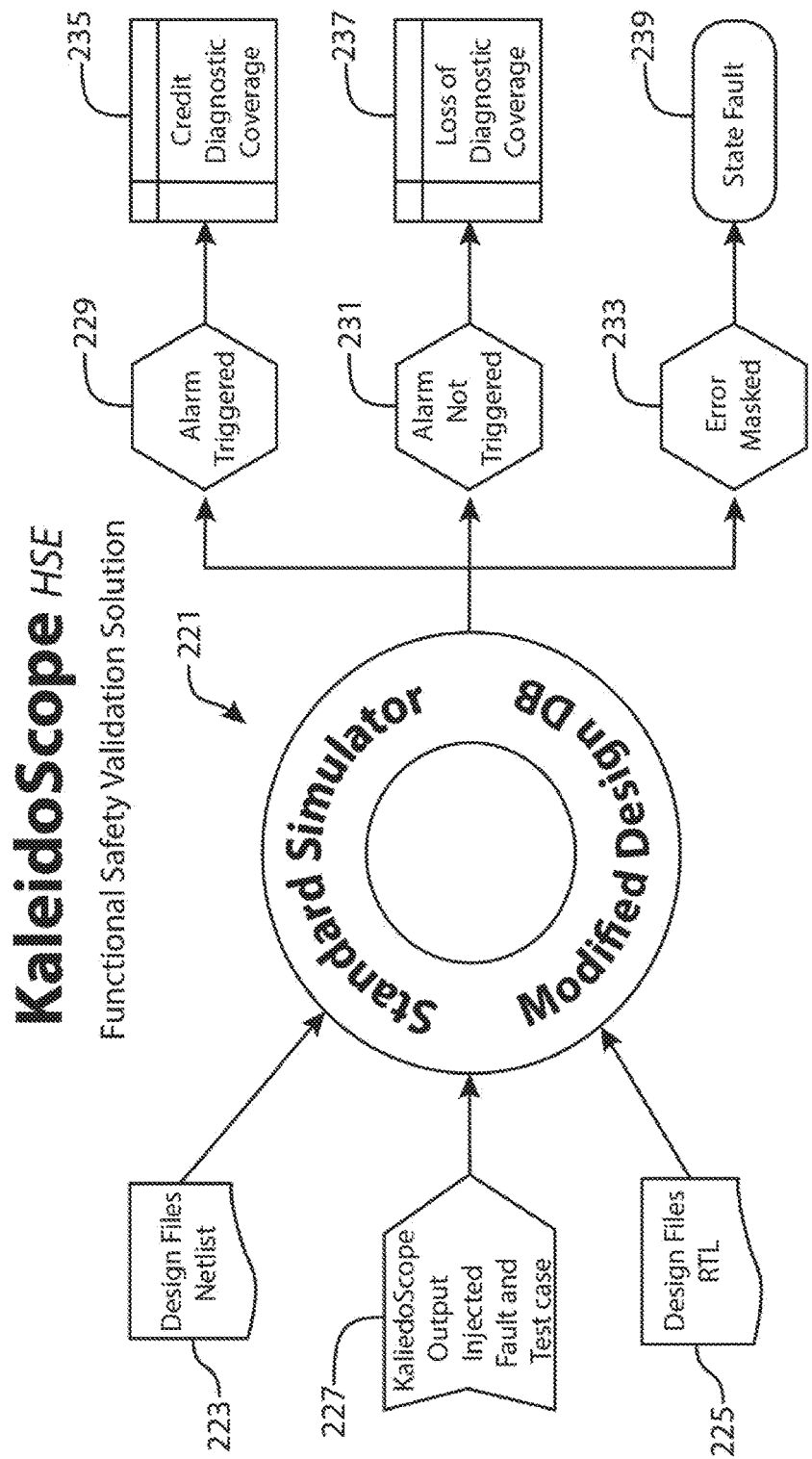
FIG. 9 is an illustration of the functionality of the KaleidoScope HSE extension for the tool suite of FIG. 1.

"Timing window" refers to a window around a clocking event during which the input to a memory element must remain stable and unchanged in order to be recognized. The concept of a timing window is illustrated in FIG. 9.

"Clock ratio" refers to the speed ratio between the frontside bus (FSB) and central processing unit (CPU) of a computational device.

Figure 10:
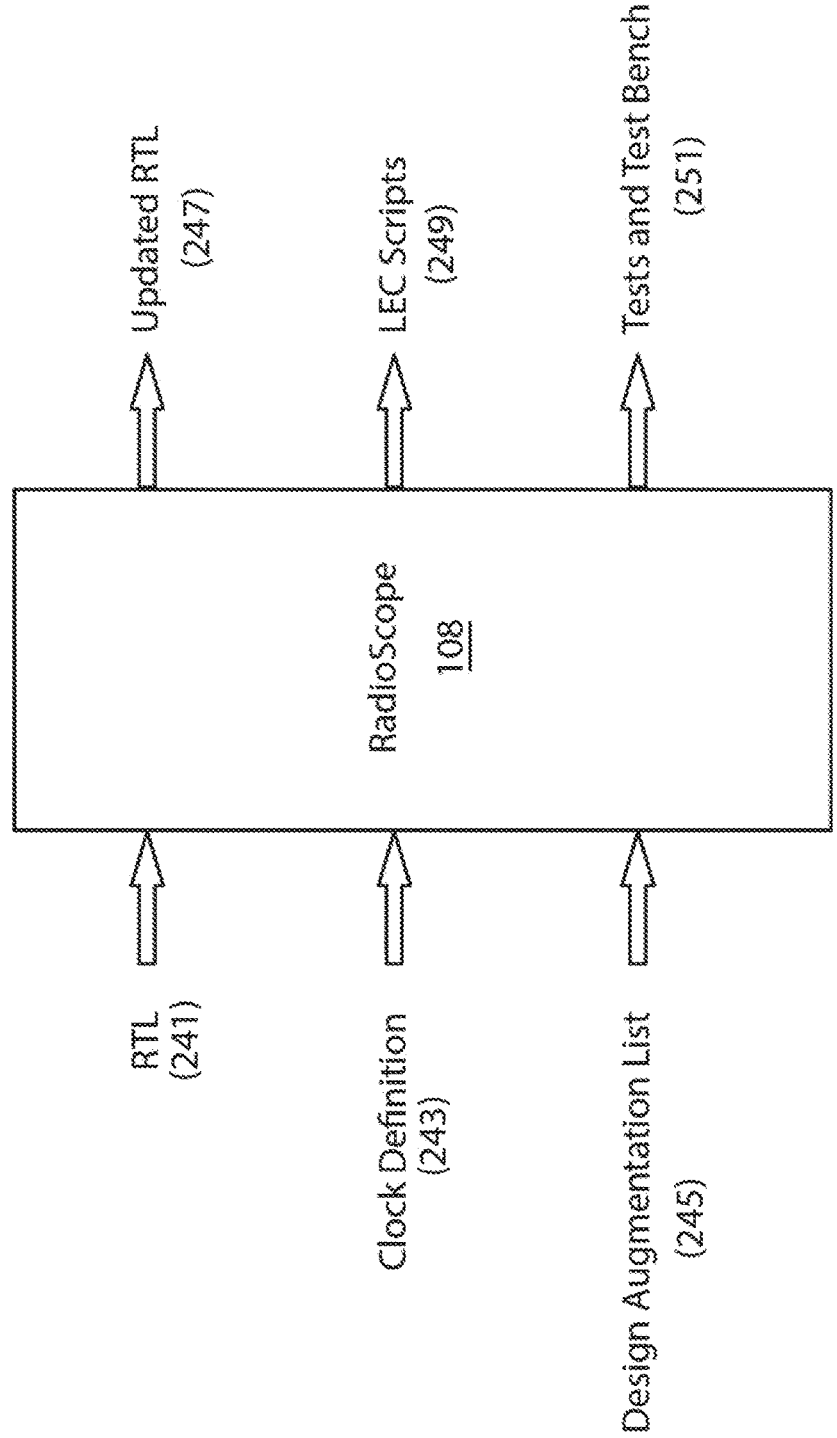
FIG. 10 is an illustration of the use of the RadioScope tool in the tool suite of FIG. 1.

"Logic cone" refers to groups of logic bordered by registers, ports, or black boxes. An example of a logic cone is depicted in FIG. 10.

"Compare point" refers to the output border of a logic cone.

"Leaf node" refers to the lowest level of abstraction in the design of a digital electronic device.

"Fault detection" refers to the process of monitoring a system and identifying when a fault has occurred. This process typically utilizes the mechanisms of duplication, error detection code (Hamming/parity) and protocol checks.

"Fault tolerance" refers to the property of enabling a system to continue operating properly in the event of the failure of some of its components. Fault tolerance systems typically employ the mechanisms of triplication (or >) and error correction code (Hamming).

"Test bench" refers to an environment (which may be a virtual environment) which is utilized to verify the correctness or soundness of a design or model.

Technical Description

A suite of tools is disclosed herein for analyzing, enhancing and verifying the robustness of designs. As seen in FIG. 1, which depicts a particular, non-limiting embodiment thereof, this suite of tools 101 includes the tools denoted SafetyScope 103, Annealer & RadioScope 105, and KaleidoScope 107. Briefly, SafetyScope 103 provides the technology to compute FIT and fault metrics 109, Annealer & RadioScope 105 ensure that the desired safety coverage is achieved 111, and KaleidoScope 107 provides parallel fault injection and propagation 113, as well as fast netlist fault simulation 115. Each of these tools is described in greater detail below.

In a preferred embodiment, this suite of tools 101 is a comprehensive functional safety suite that provides a complete end-to-end flow for certification-ready designs. It may be fully automated and may be integrated with existing electronic design automation (EDA) flows, and is scalable to designs featuring multi-millions of gates.

Figure 2:
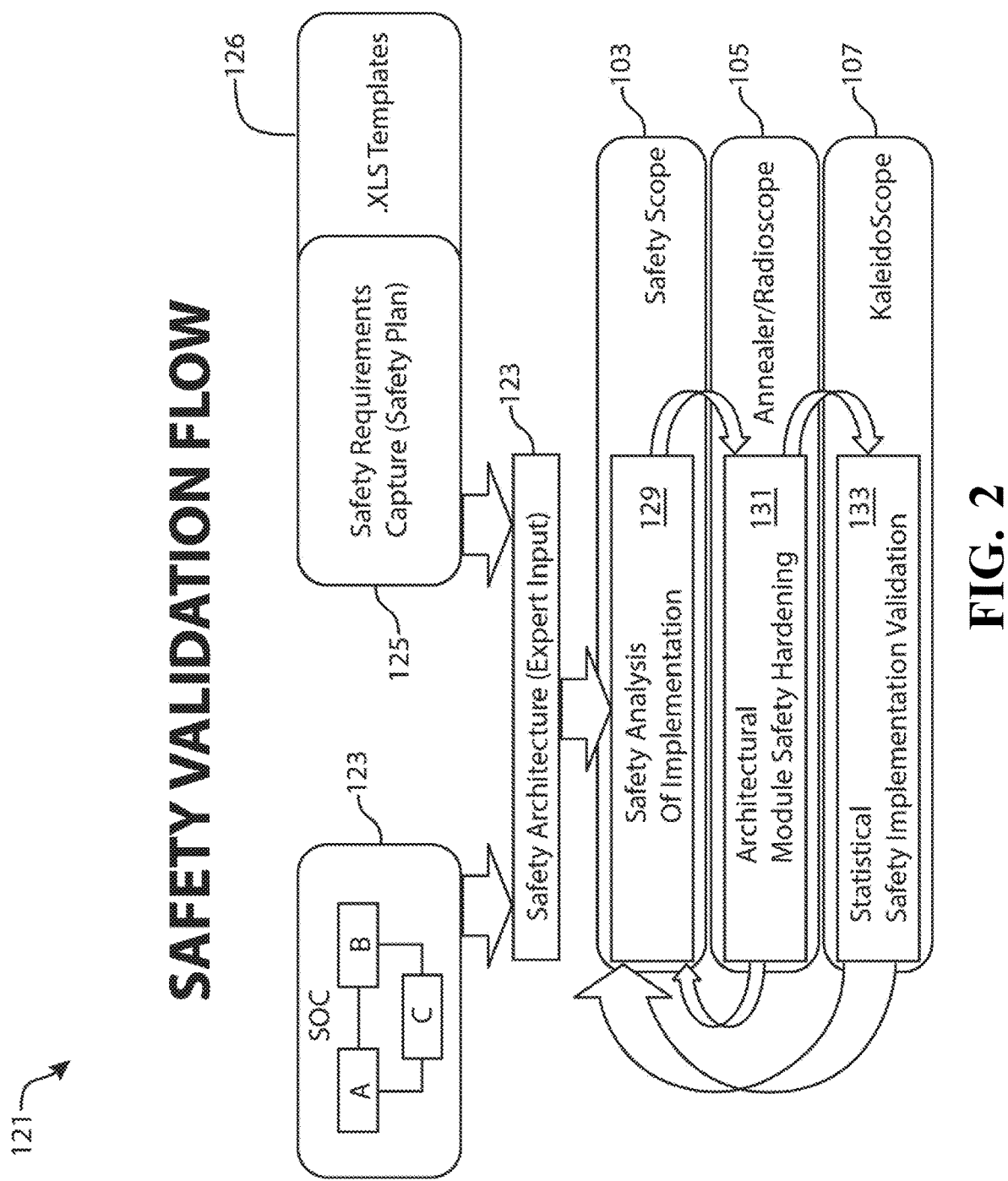
FIG. 2 is an illustration depicting the safety validation flow for the tool of FIG. 1.

FIG. 2 illustrates the manner in which the suite of tools 101 in FIG. 1 work together and may be utilized in a safety validation flow. In its preferred embodiment, the SafetyScope tool 103 is implemented as a fast, scalable solution that may be utilized to generate FIT rates, diagnostic coverage analysis and fault injection node lists. In its preferred embodiment, the Anealer & RadioScope tool 105 targets candidate nodes for improving diagnostic coverage, and provides automated logical equivalence and automatic safety feature verification. In its preferred embodiment, the Kaleidoscope tool 107 implements managed, parallel fault injection campaigns which are decoupled from the simulation framework and which may be run in HSE mode (described later with respect to FIG. 9) for the simulation of uncovered faults. Hence, the safety validation flow 121 depicted in FIG. 2 commences with the provision of a System on a Chip (SOC) deign 123 and a safety requirements capture (safety plan) 125, along with any associated (typically XML, or .XLS) templates 126. These items inform the safety architecture (expert input) 127, which may describe the safety performance levels and safety integrity levels that determine the robustness of a safety system. The safety architecture (expert input) 127 is passed to subprocess 135 for further processing by the SafetyScope tool 103, the Annealer/Radioscope 105 tool and the Kaleidoscope tool 107.

The SafetyScope tool 103 then performs a safety analysis of implementation 129, and passes the result to the Annealer/Radioscope 105 tool. The Annealer/Radioscope 105 tool performs architectural module safety hardening 131. In some cases, it may pass the result back to the SafetyScope tool 103 for a further iteration of the safety analysis, but otherwise passes the result to the Kaleidoscope tool 107 for statistical safety implementation validation 133. In some cases, the Kaleidoscope tool 107 may pass the result back to the SafetyScope tool 103 for a further implementation of the subprocess.

Figure 3:
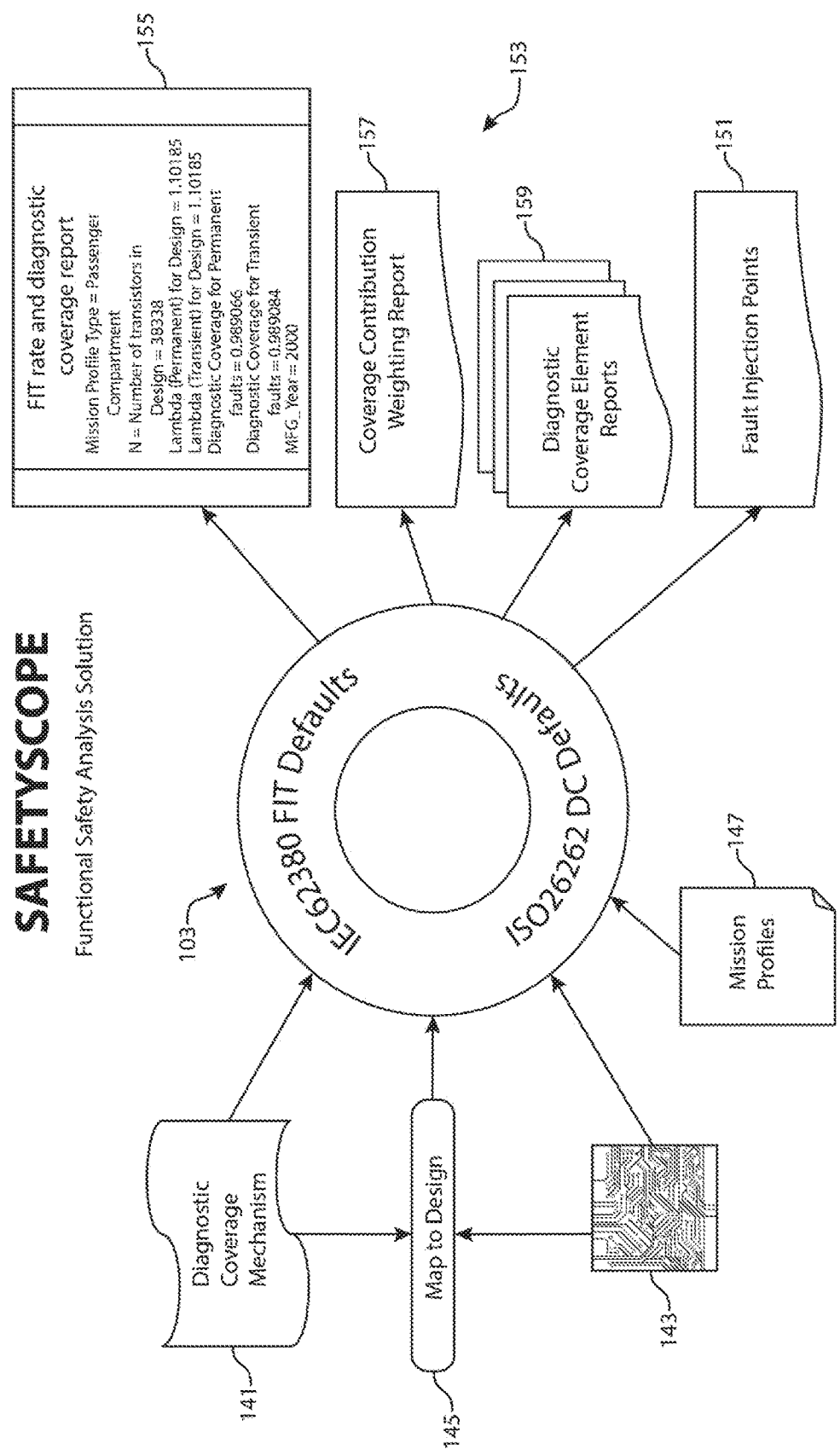
FIG. 3 is an illustration of the functionality of the SafetyScope tool in the tool suite of FIG. 1.

The functionality of the SafetyScope tool 103 may be appreciated with respect to the particular, non-limiting embodiment thereof which is depicted in FIG. 3. As seen therein, this tool utilizes diagnostic coverage mechanisms 141, digital circuit designs 143, map to design 145 and mission profiles 147 as inputs. As outputs, the SafetyScope tool 103 generates fault injection points 151 and various types of reports 153. These reports 153 include FIT rate and diagnostic coverage reports 155, coverage contribution weightage reports 157, and diagnostic coverage element reports 159.

In its preferred embodiment, the SafetyScope tool provides automated FIT rate computation, diagnostic coverage computation and fault injection point list creation. It provides hierarchical run support for fast calculation for large designs, distributed run support for scalability, and manual over-rides for reliability data. It supports VHDL, Verilog and mixed languages. It also supports analog, NV and SerDes blocks in its calculations.

Figure 4:
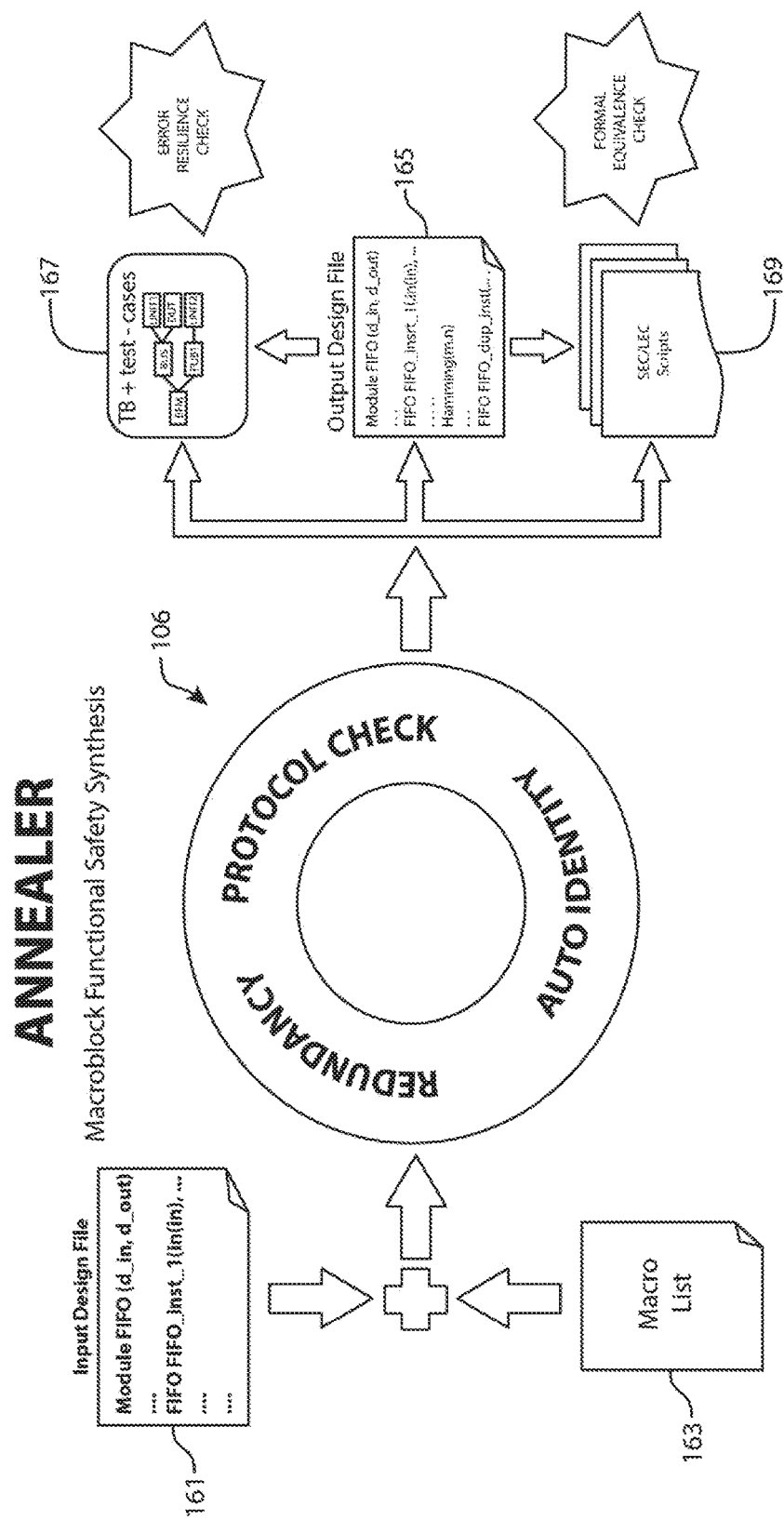
FIG. 4 is an illustration of the functionality of the Annealer tool in the tool suite of FIG. 1.
Figure 5:
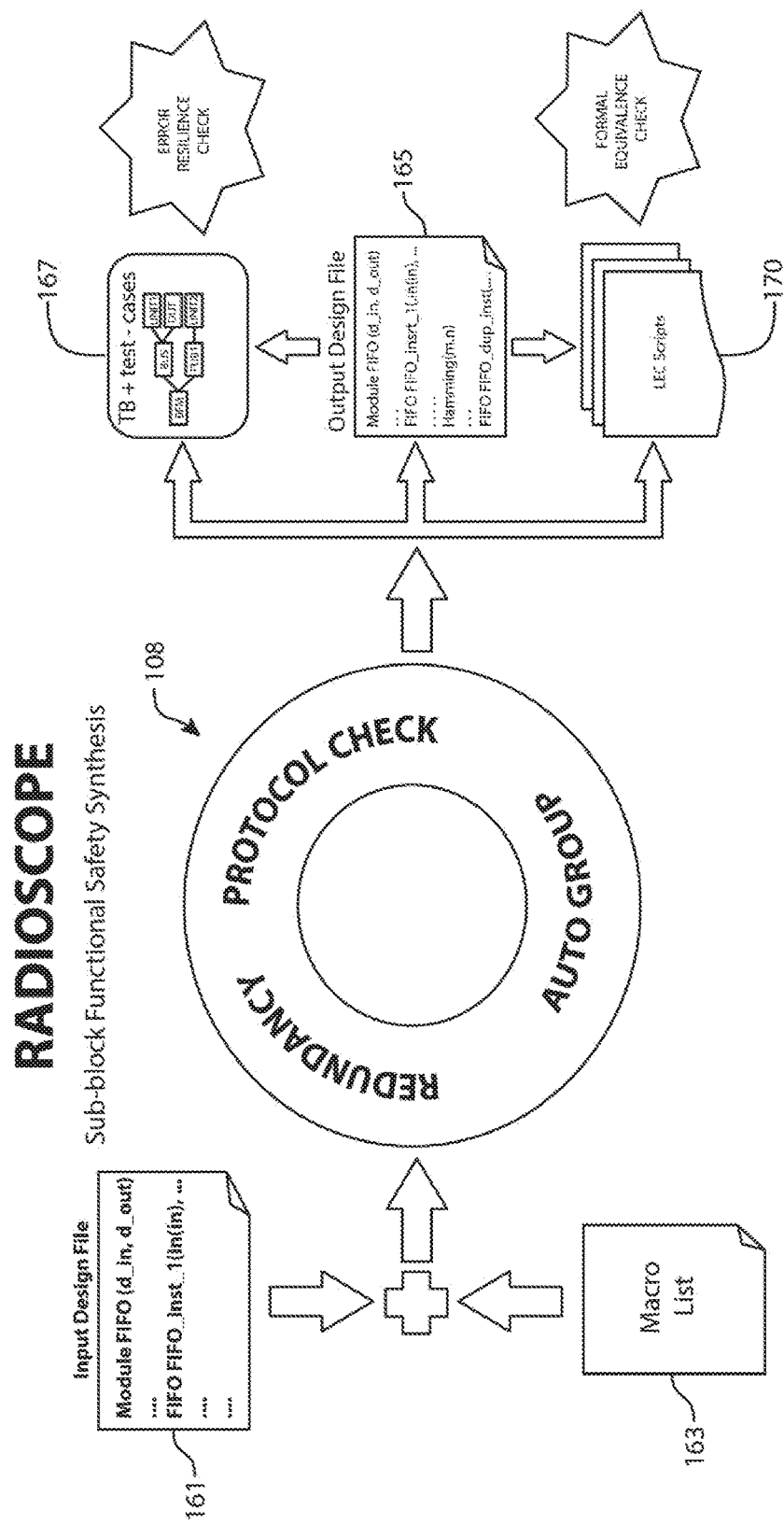
FIG. 5 is an illustration of the functionality of the RadioScope tool in the tool suite of FIG. 1.

The functionalities of the Annealer tool 106 and the RadioScope tool 108 (referred to collectively as the Annealer & RadioScope tool 105) may be appreciated from the particular, non-limiting embodiments thereof which are depicted in FIGS. 4 and 5, respectively. As seen therein, in their preferred embodiments, these tools accept as inputs design files 161 and macro lists 163, and generate output design files 165 which preferably include testbench (TB) and test cases 167 for error resiliency checks, and SEC/LEC scripts 169 (or LEC scripts 170, in the case of RadioScope tool 108) for formal equivalency checks. The safety synthesis options available with these tools are depicted in FIG. 6.

In preferred embodiments, the Annealer 106 tool and the RadioScope tool 108 offer several benefits. These include the provision of multiple safety mechanisms for macros and state elements, automated script generation for formal logic equivalence checks, and automatic safety feature verification simulation using self-checking tests. These tools recommend optimal safety feature insertion, provide suitable power, speed, area and coverage tradeoffs for best results, and provide manual over-rides in all modes of operation. As with the other tools described herein, these tools are scalable to multi-million gate designs.

Figure 7:
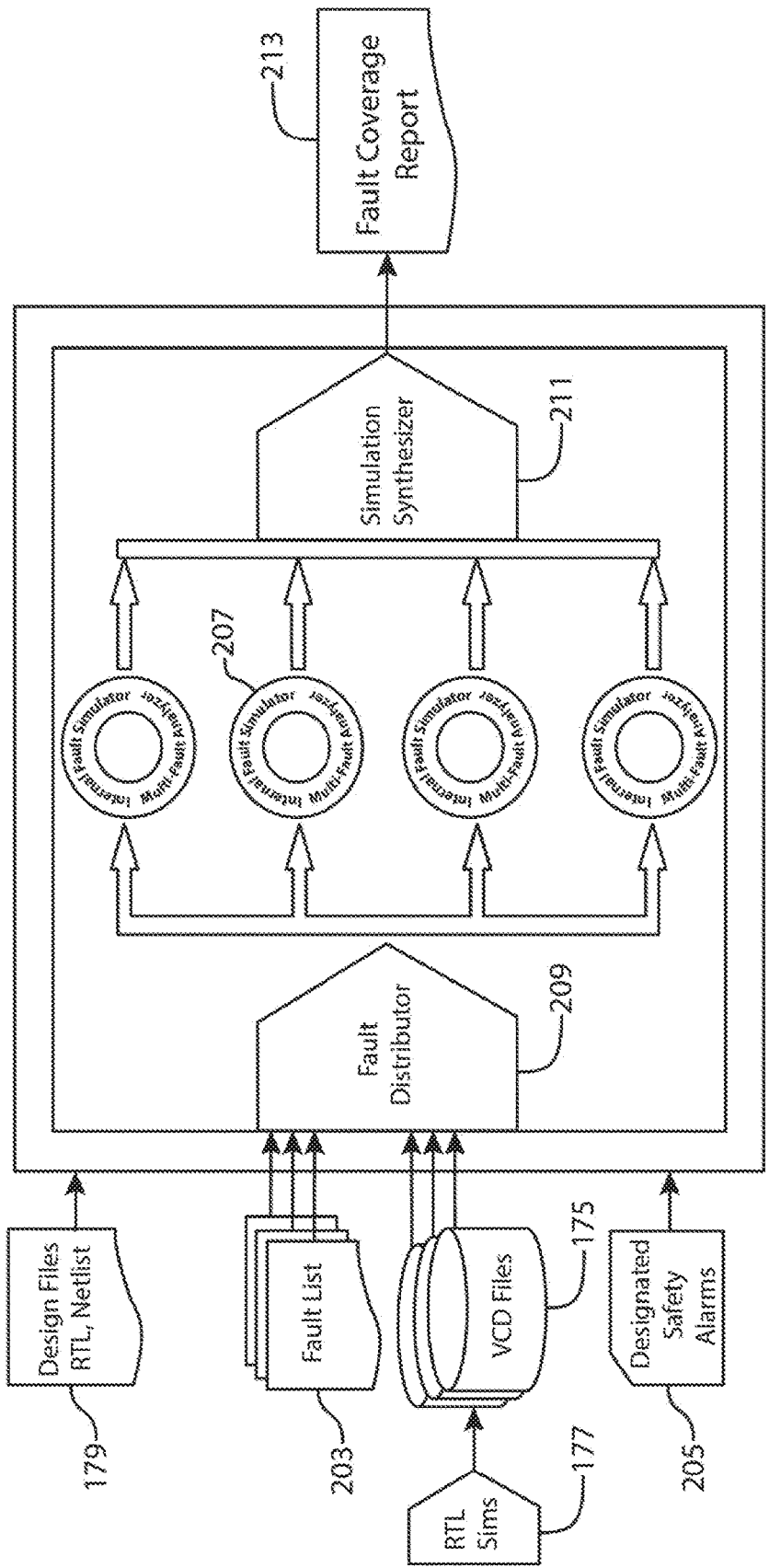
FIG. 7 is an illustration of the functionality of the KaleidoScope Manager tool in the tool suite of FIG. 1.
Figure 8:
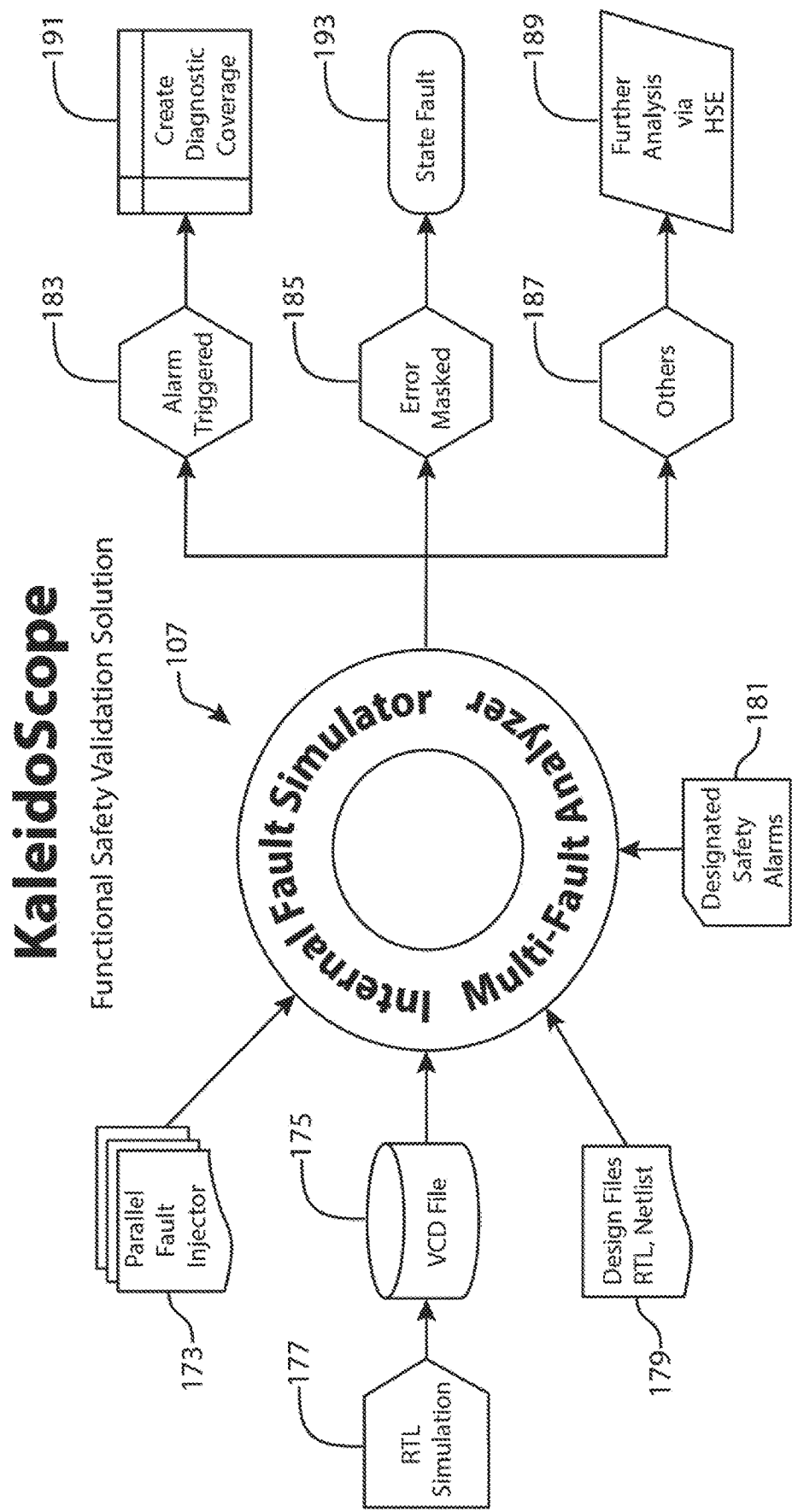
FIG. 8 is an illustration of the functionality of the KaleidoScope tool in the tool suite of FIG. 1.

FIG. 8 depicts the functionality of a particular, non-limiting embodiment of the Kaleidoscope tool 107, and FIG. 7 depicts the functionality of a particular, non-limiting embodiment of the Kaleidoscope Manager 201 which manages the Kaleidoscope tool 107. The Kaleidoscope tool 107 accepts input from a parallel fault injector 173, and also accepts as input VCD files 175 from RTL simulations 177, design files 179 (in RTL or netlist format), and designated safety alarms 181. The Kaleidoscope tool 107 generates a set of alarms that were triggered 183 (which assigns credit for diagnostic coverage 191), a set of errors that were masked 185 (which are associated with safe faults 193), and a set of other detected deviations 187 that can be subjected to further analysis 189 with the Hybrid Simulation Extension (HSE) of the tool which is described in greater detail below with respect to FIG. 9.

Referring to FIG. 7, the preferred embodiment of the Kaleidoscope Manager 201 feeds the fault list 203, the VCD files 175 from the RTL simulation 177, and designated safety alarms 205 into a fault distributor 209, the latter of which applies suitable logic to distribute faults throughout the design. The fault distributor 209 then runs simulations on the logic cones associated with the faults using a methodology described in greater detail below. Because these simulations are run on only a very small part of the overall design, several of these simulations may be run in parallel, as indicated by the plurality of internal fault simulators/multi-fault analyzers 207. The results of the simulation are then captured by a simulation synthesizer 211, which utilizes them to generate a fault coverage report 213.

FIG. 9 depicts a particular, non-limiting embodiment of the Kaleidoscope HSE tool 221. As seen therein, the Kaleidoscope HSE 221 accepts as inputs design files (in netlist 223 and/or RTL 225 format), the output 227 from the Kaleidoscope tool and the injected fault and test case 227. It generates a set of alarms that were triggered 229 (which assigns credit for diagnostic coverage 235), a set of errors that were masked 233 (which are associated with safe faults 239), and a set of alarms that were not triggered 231 (which indicate a loss of diagnostic coverage 237).

The Kaleidoscope HSE 221 tool may operate in a hybrid simulation extension mode to resolve fault coverage for fault simulations (such as, for example, those that propagate to a black box input) that yield no diagnostic coverage data in the multi-fault analyzer. It preferably includes suitable functionality to generate a modified simulation database, and preferably enables diagnostic coverage for uncovered faults via RTL simulation of extended designs. Moreover, it preferably implements simulator-agnostic technologies that work with all major logic simulators and accelerators.

The Kaleidoscope tool implements managed fault injection campaigns which feature parallel fault injection and may offer significant speedups (e.g., 100× compared to conventional gate-level fault campaigns). The VCD-based campaigns that may be implemented with the Kaleidoscope tool release simulator load bottlenecks and provide automatic classification of outcomes with diagnostic coverage reports. The tool may be equipped with HSIM extensions for comprehensive fault coverage, and may provide VHDL, Verilog and mixed language support.

FIG. 10 illustrates a particular, non-limiting embodiment of a usage case for the RadioScope tool 108. As seen therein, the tool 108 may be utilized to operate on an input RTL 241, clock definition 243 and design augmentation list 245 to generate an updated RTL 247 and LEC scripts 249, and to perform tests and implement a test bench 251. The use of the tool may involve the duplication of cones of logic, and the addition of parity, for identified flip-flops.

Figure 11:
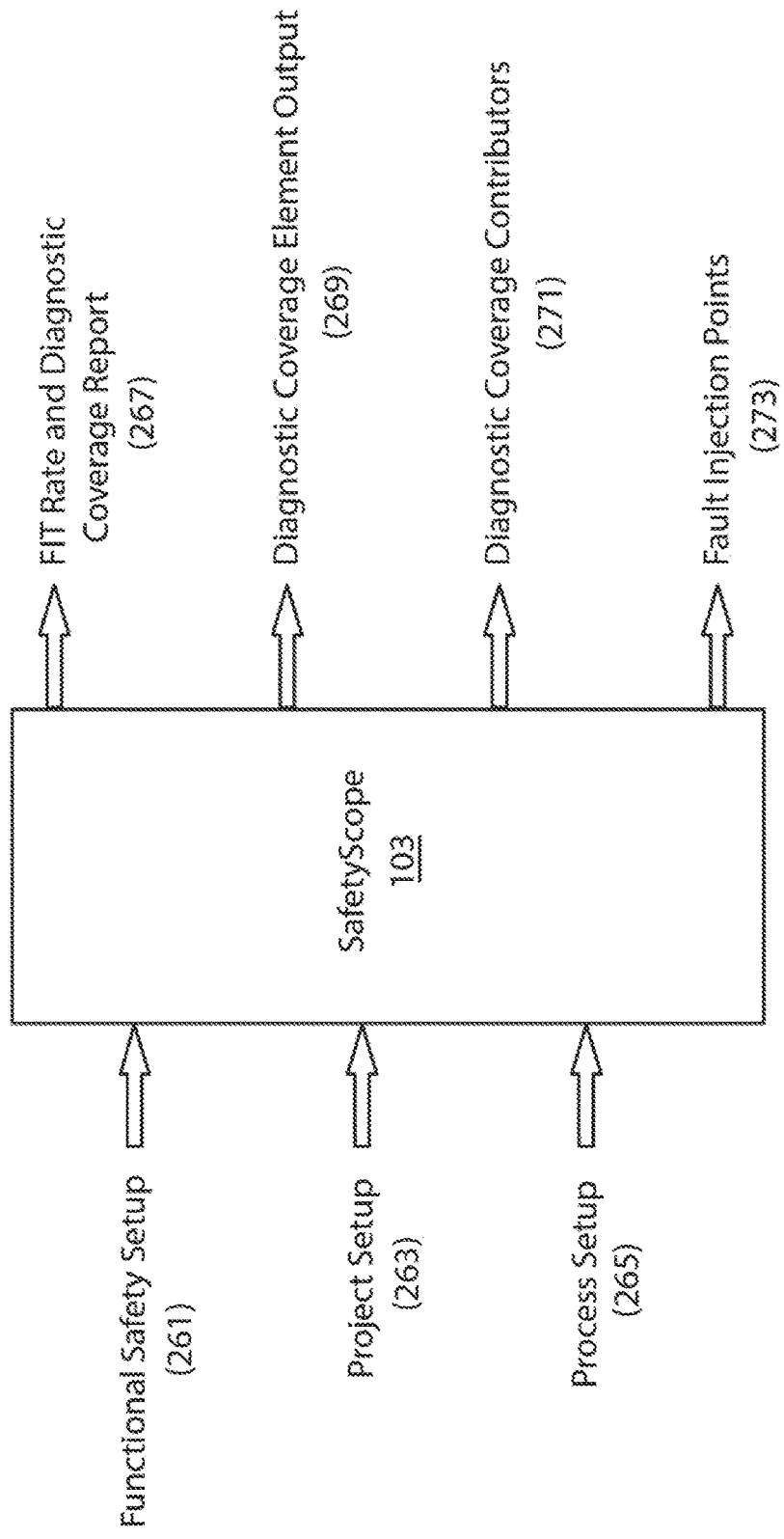
FIG. 11 is an illustration of the use of the SafetyScope tool in the tool suite of FIG. 1.

FIG. 11 depicts a typical usage case for the SafetyScope tool 103. As seen therein, the tool may be utilized to operate on an input functional safety 261, project 263 and process 265 setup to generate FIT rate and diagnostic coverage reports 267, diagnostic coverage element outputs 269, diagnostic coverage contributors 271 and fault injection points 273. The tool may operate on the RadioScope output design to compute the FIT rate, determine the diagnostic coverage element output, and generate contributor files and fault injection points.

Figure 12:
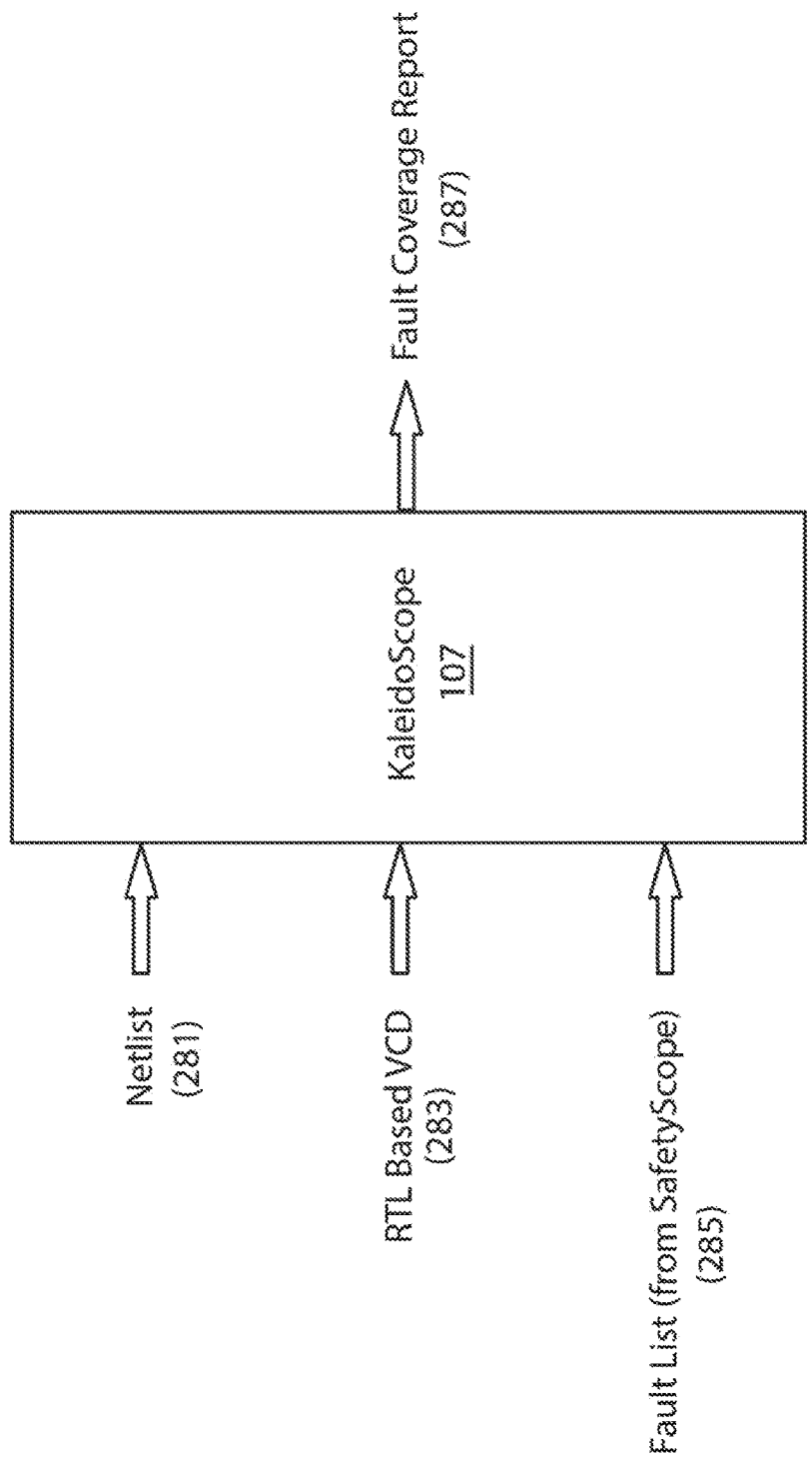
FIG. 12 is an illustration of the use of the KaleidoScope tool in the tool suite of FIG. 1.

FIG. 12 depicts a typical usage case for the KaleidoScope tool. As seen therein, the tool may be utilized to operate on an input netlist, RTL-based VCD and fault list (obtained from the SafetyScope tool) to generate a fault coverage report. The tool may be utiliozed to manage parallel fault injection runs, and to generate fault coverage reports.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for analyzing failure rates due to soft/hard errors in the design of a digital electronic device, comprising:
   creating an error injection point by introducing a fault into a code path having a plurality of levels;
   determining an error detection point at which the introduced fault becomes detectable;
   creating a list of all of the logic cells forming the cone of logic that forms the data input to the error detection point, thereby generating a first logic cone list;
   creating a list of all of the logic cells forming the cone of logic that forms the data input to the error injection point, thereby generating a second logic cone list;
   determining the intersection between the first and second logic cone lists; and
   conducting a failure rate analysis on the intersection between the first and second logic cone lists by:
      creating, on a computational device, a list of the storage elements in the intersection, thereby generating a storage element list;
      defining a storage element FIT counter;
      for each storage element in the storage element list,
         (a) reading the storage element,
         (b) adding the FIT rate of the storage element to the storage element FIT counter,
         (c) creating a list of all of the logic cells forming the cone of logic that forms the data input to the storage element, thereby generating a logic cone list,
         (d) for each cell in the logic cone list associated with the storage element,
            (i) reading the cell, and
            (ii) if the cell is a pass-through cell, then adding the FIT rate to the storage element FIT counter, and otherwise adding ½ of the FIT rate to the storage element FIT counter,
         (e) computing the clock ratio for the storage element,
         (f) determining the product of the clock ratio and the storage element FIT counter, and
         (g) adding the product to the storage element FIT counter; and
      after all of the storage elements in the storage element list have been read, outputting the value of the storage element FIT counter as the failure rate of the design.

2. A method for analyzing failure rates due to soft/hard errors in the design of a digital electronic device, comprising:
   creating, on a computational device, a list of the storage elements in the design, thereby generating a storage element list;
   identifying a state machine in the design;
   extracting a cone of logic associated with the identified state machine; and
   performing a protocol check on the state machine by defining a set of permissible states for the state machine, defining a set of sequence rules which identifies permissible transitions between the defined states, automatically extracting the set of permissible states and the set of sequence rules from the state machine during the protocol check on the state machine.

3. The method of claim 2, further comprising:
   returning an error if either (a) the state machine assumes a state that is not a permissible state, or (b) the state machine undergoes a transition that is not identified as permissible in the sequence rules.

4. The method of claim 2, further comprising:
   creating at least one copy of the cone of logic associated with the identified state machine; and
   comparing the at least one copy of the cone logic with the original cone logic to detect any deviations between them.

5. A method for verifying single point errors in the design of a digital electronic device, comprising:
   creating, on a computational device, a list of the storage elements in the design, thereby generating a storage element list;
   injecting a plurality of single point faults into the design such that at least one of the plurality of single point faults is injected into the design; and
   independently performing a fault campaign on each of the plurality of single point faults in a single run by running a full-blown simulation on the design, creating a vector change dump, determining the logic cells forming the cone of logic that forms the data input to each of the fault injection points, thereby generating a logic cone list associated with the fault injection point, and computing parity after injection of the fault for every flipflop in each logic cone list associated with a fault injection point.

6. The method of claim 5, wherein independently performing a fault campaign on each of the plurality of single point faults includes independently disposing of each of the plurality of single point faults as detected or not detected.

7. The method of claim 5, further comprising:
   storing the results of the parity computation if, and only if, the parity computed after fault injection does not match the original design.

8. The method of claim 7, wherein the parity of the original design is used for every flipflop in each logic cone list associated with a fault injection point if the parity computed after fault injection matches the original design.

* * * * *